(12) United States Patent
Brox

(10) Patent No.: US 6,906,569 B2
(45) Date of Patent: Jun. 14, 2005

(54) DIGITAL SIGNAL DELAY DEVICE

(75) Inventor: Martin Brox, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/658,742

(22) Filed: Sep. 10, 2003

(65) Prior Publication Data

US 2004/0124900 A1 Jul. 1, 2004

(30) Foreign Application Priority Data

Sep. 11, 2002 (DE) ............................. 102 41 982

(51) Int. Cl.⁷ .............................................. H03H 11/26
(52) U.S. Cl. .................... 327/276; 327/269; 327/277; 327/284
(58) Field of Search ........................ 327/269, 276–278, 327/284, 299

(56) References Cited

U.S. PATENT DOCUMENTS

| | | | |
|---|---|---|---|
| 5,374,860 A | | 12/1994 | Llewellyn |
| 5,459,422 A | * | 10/1995 | Behrin ..................... 327/276 |
| 5,644,261 A | * | 7/1997 | Frisch et al. ............. 327/277 |
| 6,087,887 A | * | 7/2000 | Lim et al. ................ 327/416 |
| 6,175,605 B1 | * | 1/2001 | Chi ......................... 375/371 |
| 6,624,667 B2 | * | 9/2003 | Nii ........................... 327/77 |

FOREIGN PATENT DOCUMENTS

| | | |
|---|---|---|
| DE | 196 03 469 C 2 | 10/1998 |
| DE | 198 45 115 C 2 | 8/2000 |
| DE | 101 30 123 A 1 | 1/2003 |
| JP | 11-284496 | 10/1999 |

* cited by examiner

Primary Examiner—Timothy P. Callahan
Assistant Examiner—An T. Luu
(74) Attorney, Agent, or Firm—Banner & Witcoff, Ltd.

(57) ABSTRACT

The invention relates to a digital signal delay device (101) for converting a signal (IN) into a corresponding delayed signal (OUT), comprising a plurality of signal delay elements (103a, 103b, 103c) connected in series, wherein, as a function of the desired delay of the delayed signal (OUT), the output signal of a particular signal delay element (103a, 103b, 103c) is used for generating the delayed signal (OUT), and wherein the signal delay elements (103a, 103b, 103c) each comprise one single inverter (105, 106, 107) only.

15 Claims, 4 Drawing Sheets

DIGITAL SIGNAL DELAY DEVICE

Figure 1:
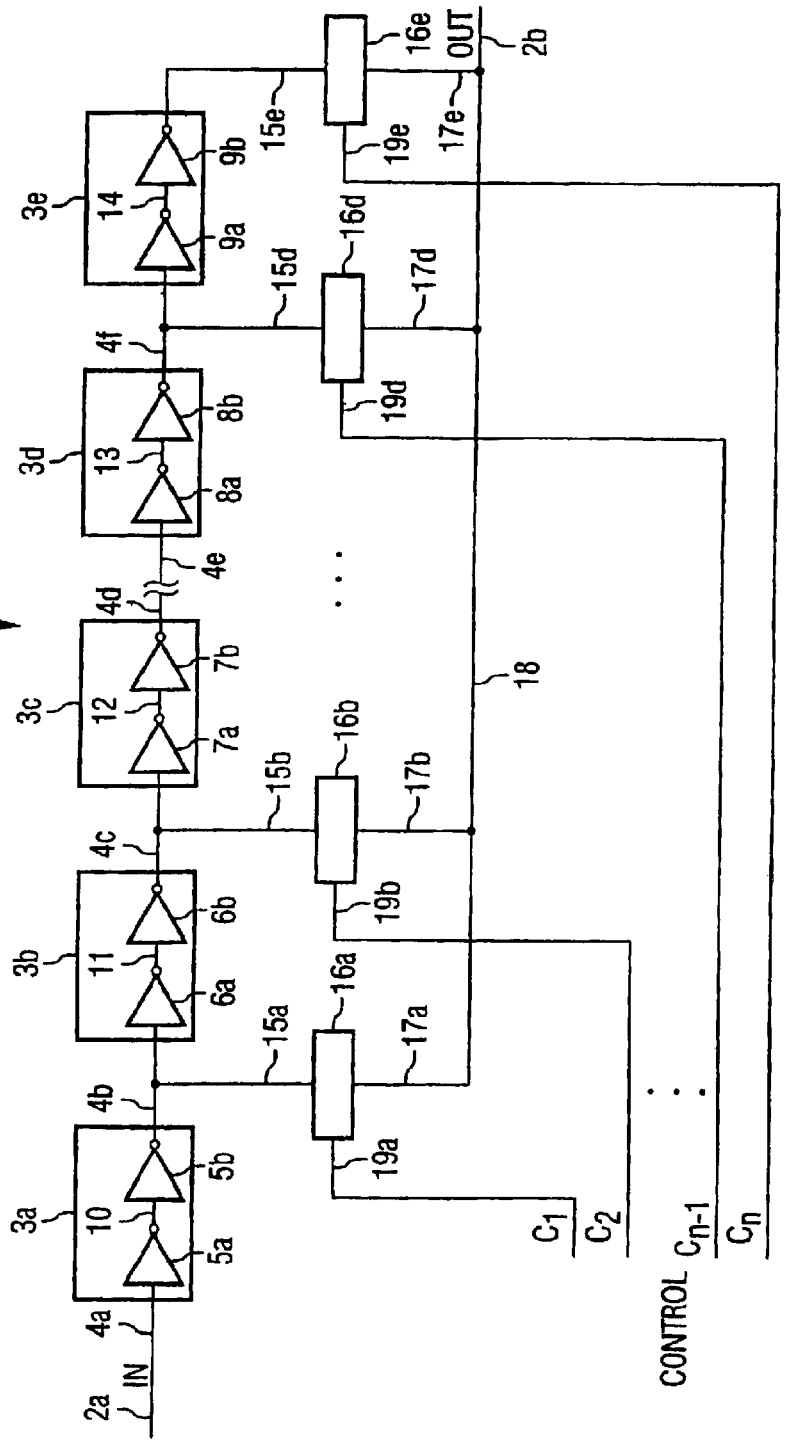

The invention relates to a digital signal delay device in accordance with the preamble of claim 1.

In semiconductor elements, delay lock loops are often used for generating the internal clock. These consist e.g. of many delay members that are connected in series.

A delay member serves to apply a delay to a digital signal available at the input of the delay member, so that a digital output signal may be tapped at the output of the delay member, said output signal being delayed vis-à-vis the input signal, but corresponding to it otherwise.

A delay member may e.g. consist of two inverters connected in series, in particular CMOS inverters. The input of the first inverter forms the input, and the output of the second inverter forms the output of the delay member, the output of the first inverter being connected to the input of the second inverter.

When the state of the signal available at the input of the delay member or of the first inverter, respectively, changes, e.g. from "logically low" to "logically high" (—or vice versa from "logically high" to "logically low"—), the signal at the output of the first inverter (and accordingly also the signal at the input of the second inverter) changes—after a predetermined delay time $t_a$—its state from "logically high" to "logically low" (—or vice versa from "logically low" to "logically high"—).

Consequently, the signal at the output of the second inverter or at the output of the delay member, respectively, changes—again after a predetermined delay time $t_b$—its state from "logically low" to "logically high" (—or vice versa from "logically high" to "logically low"—).

The signal at the output of the delay member thus corresponds to the signal at its input, with the exception that it is delayed vis-à-vis thereto by a—total—signal delay time of $T=t_a+t_b$.

To provide an element or a signal delay device, respectively, with adjustable signal delay time, a plurality of delay members of the above-mentioned type may be connected in series.

The signal at the output of the n-th delay member is delayed by n×T vis-à-vis the signal at the input of such a signal delay device.

The outputs of the delay members may—except with the respectively following delay member—additionally be connected with the (total) output of the signal delay device, e.g. by means of corresponding transfer gates.

By means of the transfer gates, that delay member may be selected, the output signal of which is to be connected through to the output of the signal delay device.

This way, the delay of the (total) output signal can be adjusted with respect to the signal available at the input of the signal delay device or at its first delay member, respectively.

By means of a signal delay device of the above-mentioned type, the total signal delay which is applied to the input signal is, however, adjustable with relatively coarse exactness only.

It is an object of the invention to provide a novel digital signal delay device.

This and further objects of the invention are achieved by the subject matter of claim 1.

Advantageous further developments of the invention are indicated in the subclaims.

In accordance with a basic idea of the invention, a digital signal delay device is provided for converting a signal (IN) to a delayed signal (OUT) corresponding thereto, said device comprising a plurality of signal delay elements connected in series, wherein, depending on the desired delay of the delayed signal (OUT), the output signal of a particular signal delay element is respectively used for generating the delayed signal (OUT), and wherein each of the signal delay elements comprises one single inverter only.

Depending on the respectively desired delay, the output signal of the respective signal delay element used for generating the delayed signal (OUT) may then be inverted or not inverted vis-à-vis the signal (IN).

Of advantage is a development where the signal delay elements are respectively connected with corresponding switching devices, wherein—depending on the respectively desired delay—that switching device is activated that is connected with the signal delay element whose output signal is to be used for generating the delayed signal (OUT).

Preferably—depending on whether the output signal of a particular signal delay element is inverted or not inverted vis-à-vis the signal (IN)—the switching device connected with the respective signal delay element is correspondingly designed such that—on activation—it advances the output signal in a non-inverted or in an inverted manner.

The result is that the respectively advanced, delayed signal corresponds to the signal (IN)—which is e.g. available at the input of the signal delay device—(i.e. is identical, or alternatively complementary thereto), and has an—adjustable—delay vis-à-vis to it (namely a delay which substantially corresponds to the delay time of the output signal of that signal delay element whose output signal is—possibly in inverted form—advanced via the corresponding switching device.

Since the corresponding signal delay elements each only comprise one single inverter, and not e.g. two inverters connected in series, the respectively desired delay time can be adjusted substantially more accurately or precisely than with conventional digital signal delay devices.

Figure 2:
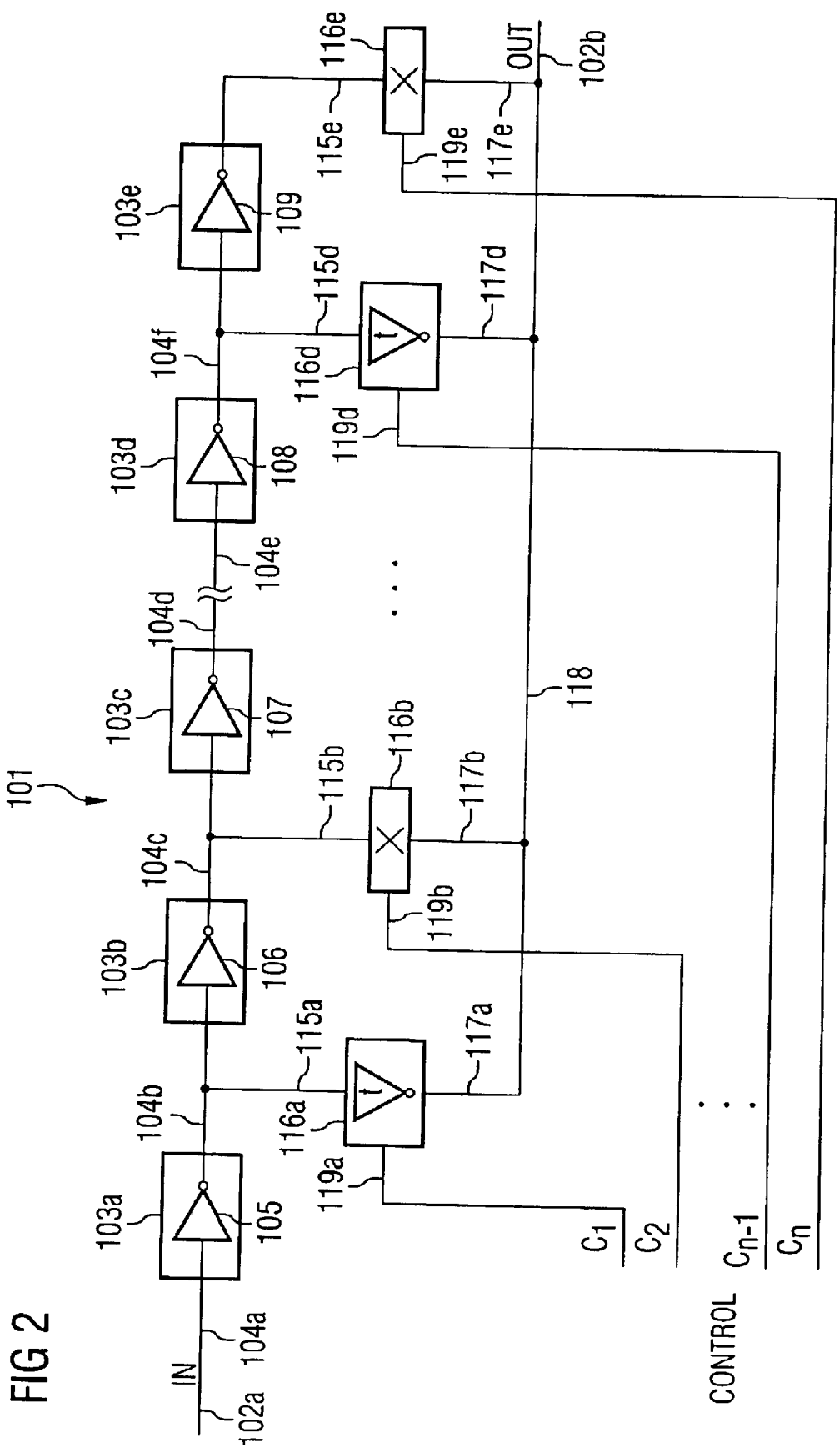
Figure 3:
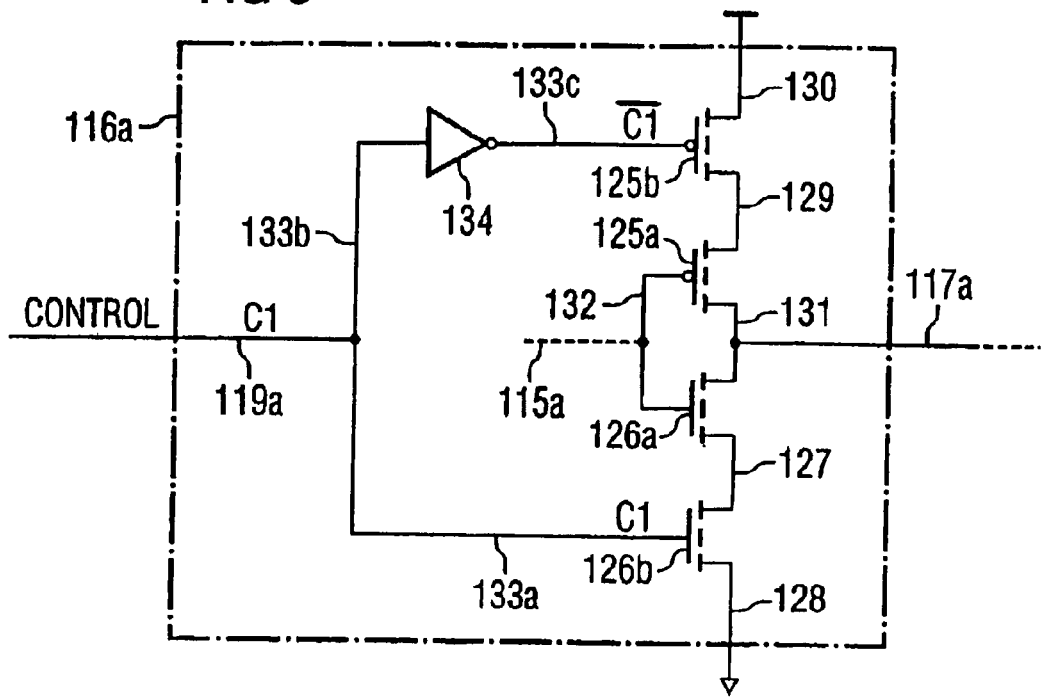
Figure 4:
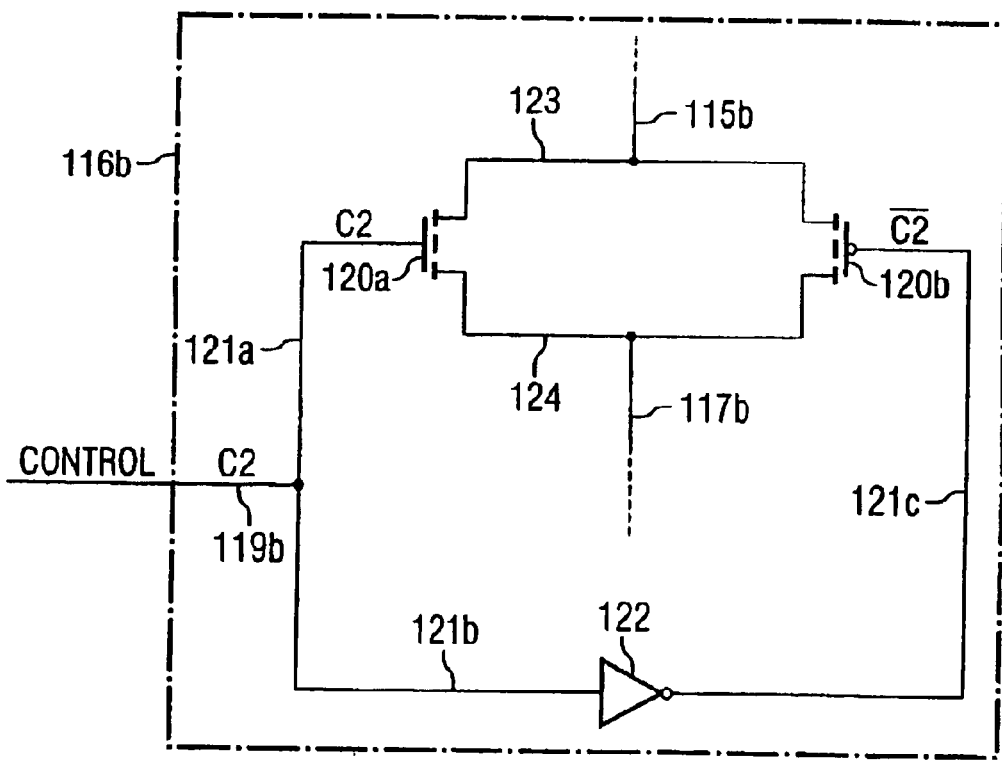
Figure 5A:
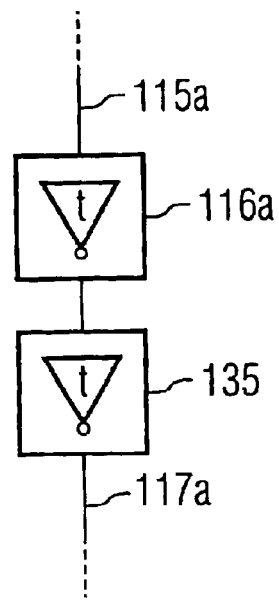

In the following, the invention will be explained in more detail by means of several embodiments and the enclosed drawing. The drawing shows:

FIG. 1 a schematic representation of a circuit arrangement of a digital signal delay device according to prior art;

FIG. 2 a schematic representation of a circuit arrangement of a digital signal delay device in accordance with an embodiment of the present invention;

FIG. 3 a schematic representation of an inverter circuit arrangement used as a gate of the first kind with the digital signal delay device illustrated in FIG. 2;

FIG. 4 a schematic representation of a transfer gate circuit arrangement used as a gate of the second kind with the digital signal delay device illustrated in FIG. 2;

FIG. 5a a schematic representation of a gate of the first kind used with an alternative embodiment of a signal delay device, and of a tristate inverter additionally connected behind the respective gate of the first kind.

Figure 5B:
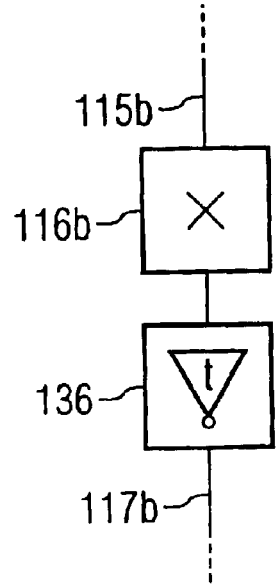
Figure 6A:
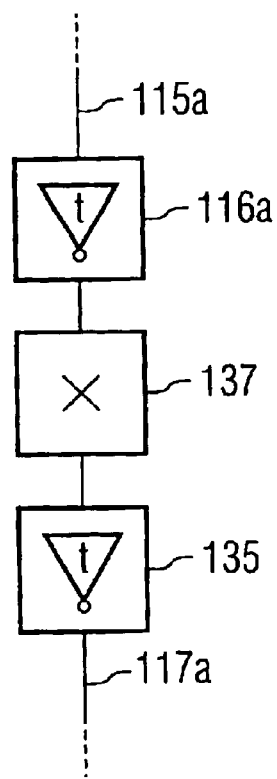
Figure 6B:
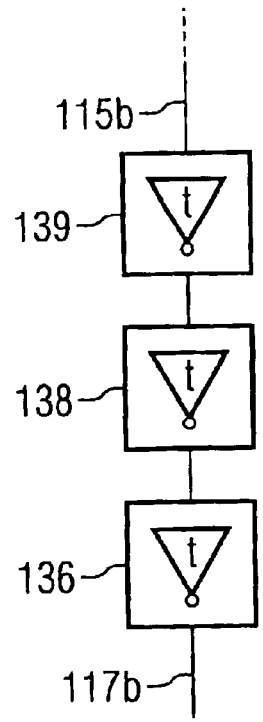

FIG. 5b a schematic representation of a gate of the second kind used with the alternative embodiment of a signal delay device, and of a tristate inverter additionally connected behind the gate;

FIG. 6a a schematic representation of a gate of the first kind used with a modification of the alternative embodiment, and of a transfer gate connected therebehind, and of a tristate inverter; and FIG. 6b a schematic representation of a gate of the first kind used with the modification of the alternative embodiment, which is used instead of the gate of the second kind as illustrated in FIG. 5b, and of two tristate converters connected therebehind.

FIG. 1 shows a schematic representation of a circuit arrangement of a digital signal delay device 1 in accordance with prior art.

The signal delay device 1 serves to apply an—adjustably high—delay to a digital signal IN available at an input 2a of the signal delay device 1, so that a digital signal OUT—which is delayed vis-à-vis the input signal IN—can be tapped at the output 2b of the signal delay device 1.

As is shown in FIG. 1, the signal delay device 1 comprises a plurality of signal delay elements 3a, 3b, 3c, 3d, 3e connected in series. The number n of signal delay elements 3a, 3b, 3c, 3d, 3e is—as will be explained in detail below—chosen as a function of that signal delay that is to be obtained maximally with the signal delay device 1.

The first signal delay element 3a is connected with the input 2a of the signal delay device 1 via a line 4a, and—via a line 4b—with the input of the second signal delay element 3b. The output of the second signal delay element 3b is connected to the input of the third signal delay element 3c via a line 4c. Correspondingly, the output of the third signal delay element 3c is connected with the input of a further (not illustrated) signal delay element via a line 4d, etc.

As is further shown in FIG. 1, the input of the signal delay element 3d is connected to the output of a preceding (not illustrated, either) signal delay element via a line 4e, and the input of the signal delay element 3e is connected to the output of the signal delay element 3d via a line 4f.

Each signal delay element 3a, 3b, 3c, 3d, 3e comprises two inverters 5a, 5b, or 6a, 6b, or 7a, 7b, or 8a, 8b, or 9a, 9b, connected in series.

The input of the respectively first inverter 5a, 6a, 7a, 8a, 9a of each signal delay element 3a, 3b, 3c, 3d, 3e forms the respective input of the corresponding signal delay element 3a, 3b, 3c, 3d, 3e (i.e. is connected with the corresponding line 4a, 4b, 4c, 4e, 4f), and the output of the respectively first signal delay element inverter 5a, 6a, 7a, 8a, 9a is connected with the respective input of the respectively second signal delay element inverter 5b, 6b, 7b, 8b, 9b via corresponding connecting lines 10, 11, 12, 13, 14. The output of the respectively second inverter 5b, 6b, 7b, 8b, 9b of each signal delay element 3a, 3b, 3c, 3d, 3e forms the respective output of the corresponding signal delay element 3a, 3b, 3c, 3d, 3e (i.e. is connected with the corresponding line 4b, 4c, 4d, 4f).

When the state of the signal IN available at the input of the first signal delay element 3a or its first inverter 5a, respectively, changes e.g. from "logically low" to "logically high" (—or vice versa from "logically high" to "logically low"—), the signal at the output of the first signal delay element inverter 5a (and accordingly also the signal at the input of the second signal delay element inverter 5b) changes—after a certain delay time $t_a$—its state from "logically high" to "logically low" (—or vice versa from "logically low" to "logically high"—). Consequently, the signal at the output of the second signal delay element inverter 5b or at the output of the first signal delay element 3a, respectively, changes—again after a certain delay time $t_b$ —its state from "logically low" to "logically high" (—or vice versa from "logically high" to "logically low"—).

The signal at the output of the second signal delay element inverter 5b or of the first signal delay element 3a, respectively (and thus also the signal at the input of the second signal delay element 3b or its first inverter 6a, respectively) thus corresponds to the signal IN at the input of the first signal delay element 3a or its first inverter 5a, respectively, with the exception that it is delayed vis-à-vis thereto by a—total—delay element signal delay time of $T=t_a+t_b$.

As has been explained above, the remaining signal delay elements 3b, 3c, 3d, 3e have a structure that is correspondingly identical to that of the first signal delay element 3a.

Consequently—when the state of the signal available at the respective input of the respective signal delay element 3b, 3c, 3d, 3e or its respectively first inverter 6a, 7a, 8a, 9a changes e.g. from "logically low" to "logically high" (—or vice versa from "logically high" to "logically low"—)—again after a particular delay element (total) signal delay time T—the signal at the output of the respective signal delay element 3b, 3c, 3d, 3e or its respectively second inverter 6b, 7b, 8b, 9b also changes its state from "logically low" to "logically high" (—or vice versa from "logically high" to "logically low"—).

The signal available e.g. at the output of the second signal delay element 3b (and thus also the signal at the input of the third signal delay element 3c or its first inverter 7a, respectively) thus corresponds to the signal IN at the input of the first signal delay element 3a or its first inverter 5a, respectively, with the exception that it is delayed vis-à-vis thereto—in total—by a total signal delay time of T+T=2T (the signal at the output of the n-th signal delay element thus corresponds—generally speaking—to the signal IN at the input of the signal delay device 1, with the exception that it is delayed vis-à-vis thereto—in total—by a total delay time of n×T).

As is further illustrated in FIG. 1, the output of the first signal delay element 3a is—except that it is connected via the line 4b with the input of the second signal delay element 3b—additionally connected via a line 15a with the input of a first gate, e.g. a transfer gate 16a.

Correspondingly, the outputs of the remaining signal delay elements 3b, 3c, 3d, 3e each are also connected with the input of corresponding further gates, in particular transfer gates 16b, 16d, 16e, via corresponding lines 15b, 15d, 15e.

The outputs of the transfer gates 16a, 16b, 16d, 16e are connected via corresponding lines 17a, 17b, 17d, 17e to a line 18 which is connected with the output 2b of the signal delay device 1.

Corresponding control signals $C_1, C_2, \ldots, C_{n-1}, C_n$ are applied to the control inputs 19a, 19b, 19d, 19e of the transfer gates 16a, 16b, 16d, 16e, as will be explained in detail further below. In the case of a "logically low" control signal $C_1, C_2, \ldots, C_{n-1}, C_n$ the respective transfer gate 16a, 16b, 16d, 16e is in a "locked" state, and in the case of a "logically high" control signal $C_1, C_2, \ldots, C_{n-1}, C_n$ it is in a "conductive" state. In the case of a "conductive" state, the signal available at the input of the respective transfer gate 16a, 16b, 16d, 16e is connected through to its output (and in the case of a "locked" state disconnected from the transfer gate output).

By the fact that respectively one of the control signals $C_1, C_2, \ldots, C_{n-1}, C_n$ is selected such that it is in a "logically high" state, and the respective other control signals $C_1, C_2, \ldots, C_{n-1}, C_n$ are selected such that they are in a "logically low" state, that signal delay element 3a, 3b, 3c, 3d, 3e may be selected whose output signal is to be connected through to the output 2b of the signal delay device 1.

The signal OUT that is output at the output 2b of the signal delay device 1 is thus applied with a delay vis-à-vis the signal at the input 2a of the signal delay device 1, said delay corresponding to the delay time of the output signal of that signal delay element 3a, 3b, 3c, 3d, 3e whose output is just being connected through to the output 2b of the signal delay device 1 via the corresponding transfer gate 16a, 16b, 16d, 16e (plus the delay time of the respective transfer gate 16a, 16b, 16d, 16e connected through).

FIG. 2 shows a schematic representation of a circuit arrangement of a digital signal delay device 101 in accordance with an embodiment of the present invention.

The signal delay device 101 may e.g. be installed in a DRAM memory element based e.g. on CMOS technology (or in any other element). It serves to apply an—adjustably high—delay to a digital signal IN available at an input 102a of the signal delay device 101, so that a digital signal OUT—delayed vis-à-vis the input signal IN—can be tapped at the output 102b of the signal delay device 101.

As is illustrated in FIG. 2, the signal delay device 101 comprises a plurality of signal delay elements 103a, 103b, 103c, 103d, 103e that are connected in series. The number n of signal delay elements 103a, 103b, 103c, 103d, 103e is as will be explained more exactly further below—selected as a function of that signal delay that is to be achieved maximally with the signal delay device 101.

The first signal delay element 103a is connected via a line 104a with the input 102a of the signal delay device 101 and—via a line 104b—with the input of the second signal delay element 103b. The output of the second signal delay element 103b is connected to the input of the third signal delay element 103c via a line 104c. Correspondingly, the output of the third signal delay element 103 is connected via a line 104d with the input of a further (not illustrated) signal delay element, etc.

As is further illustrated in FIG. 2, the input of the signal delay element 103d is connected via a line 104e to the output of a preceding (not illustrated, either) signal delay element, and the input of the signal delay element 103e is connected via a line 104f to the output of the signal delay element 103d.

Each signal delay element 103a, 103b, 103c, 103d, 103e comprises—different from the signal delay device illustrated in FIG. 1—only one single inverter 105, 106, 107, 108, 109 (instead of two inverters connected in series), wherein the input of the respective inverter 105, 106, 107, 108, 109 forms the respective input of the corresponding signal delay element 103a, 103b, 103c, 103d, 103e (i.e. is connected with the corresponding line 104a, 104b, 104c, 104e, 104f), and wherein the output of the respective inverter 105, 106, 107, 108, 109 forms the respective output of the corresponding signal delay element 103a, 103b, 103c, 103d, 103e (i.e. is connected with the corresponding line 104b, 104c, 104d, 104f).

When the state of the signal IN available at the input of the signal delay device 101 (and thus at the input of the first signal delay element 103a or the inverter 105, respectively) changes e.g. from "logically low" to "logically high" (—or vice versa from "logically high" to "logically low"—), the signal at the output of the first signal delay element 103a or of the inverter 105, respectively (and accordingly also the signal at the input of the second signal delay element 103b or of the inverter 106, respectively) changes—after a certain delay time t—its state from "logically high" to "logically low" (—or vice versa from "logically low" to "logically high"—).

The signal at the output of the first signal delay element 103a or of the inverter 105, respectively, thus corresponds to the signal IN at the input of the first signal delay element 103a or of the inverter 105, respectively, with the exception that it is inverted and delayed by a delay time t vis-à-vis thereto.

When, as explained above,—after the delay time t—the signal at the output of the first signal delay element 103a (or of the inverter 105, respectively) and accordingly also the signal at the input of the second signal delay element 103b (or of the inverter 106, respectively) changes its state from "logically high" to "logically low" (—or vice versa from "logically low" to "logically high"—), the signal at the output of the second signal delay element 103b or of the inverter 106, respectively, changes—again after a certain delay time t—its state from "logically low" to "logically high" (—or vice versa from "logically high" to "logically low"—).

The signal at the output of the second signal delay element 103b or of the inverter 106, respectively, thus corresponds to the signal IN at the input of the first signal delay element 103a or of the inverter 105, respectively, with the exception that it is delayed vis-à-vis thereto—in total— by a delay time of t+t=2t.

As has been explained above, the remaining signal delay elements 103c, 103d, 103e are of a structure that is correspondingly identical to that of the first two signal delay elements 103a, 103b.

Due to the respectively inverting, delayed advancement of the digital signal that is respectively available at the input of the corresponding signal delay element 103c, 103d, 103e (as explained in analogy above with respect to the two signal delay elements 103a, 103b) by the respective signal delay element 103c, 103d, 103e, the signal at the output of the n-th signal delay element 103c, 103d, 103e thus corresponds, generally speaking, to the signal IN at the input 102a of the signal delay device 101, with the exception that it is i) delayed vis-à-vis the signal IN by a total delay time of nxt, and possibly—and only with such signal delay elements 103c, 103d in which n is an odd number—that it is ii) inverted vis-à-vis the signal IN.

As is further shown in FIG. 2, the output of the first signal delay element 103a or of the inverter 105, respectively, is—except that it is connected via the line 104b with the input of the second signal delay element 103b or of the inverter 106, respectively—additionally connected via a line 115a with the input of a gate 116a "of the first kind", as will be explained more exactly in the following.

In a correspondingly similar way is the output of the second signal delay element 103b or of the inverter 106, respectively, connected via a line 115b with the input of a gate 116b "of the second kind", as will be explained more exactly in the following.

Correspondingly, the outputs of the remaining signal delay elements 103c, 103d, 103e each are connected via corresponding lines 115d, 115e with the respective input of corresponding further gates 116d, 116e, namely, generally speaking, the respective outputs of those signal delay elements 103c, 103d in which n is an odd number are connected with the input of a corresponding gate 116d "of the first kind", and the outputs of those signal delay elements 103c, 103d in which n is an even number are connected with the input of a corresponding gate 116e "of the second kind".

In the present embodiment, e.g. the inverter circuit arrangement (in particular a tristate inverter circuit arrangement) illustrated in detail in FIG. 3 is e.g. used as a gate 116a, 116d "of the first kind", and the transfer gate circuit arrangement illustrated in detail in FIG. 4 is e.g. used as a gate 116b, 116e "of the second kind".

As is illustrated in FIG. 4, the transfer gate circuit arrangement of the gates 116b, 116e "of the second kind" comprises an n-channel field effect transistor 120a and a p-channel field effect transistor 120b.

The control signal C2 available at a control input 119b of the respective gate 116b, 116e is—via a control line 121a—supplied to the gate of the n-channel field effect transistor 120a.

Furthermore, the control signal C2 available at the control input 119b of the respective gate 116b, 116e is additionally—via a line 121b—supplied to the input of an inverter 122, and the control signal /C2 output at the output of the inverter 122 and complementary to the control signal C2 is supplied to the gate of the p-channel field effect transistor 120b.

As is further illustrated in FIG. 4, the drains of the n- or p-channel field effect transistors 120a, 120b, respectively, are connected via a line 123 with one another and additionally to the line 115b (and thus form the input of the transfer gate circuit arrangement).

Furthermore, the sources of the n- or p-channel field effect transistors 120a, 120b, respectively, are connected with one another via a line 124, and additionally with a line 117b that is connected to a line 118 (and thus form the output of the transfer gate circuit arrangement).

The following effect is achieved thereby: As soon as the control signal C2 available at the control input 119b of the gate 116b changes its state from "logically low" to "logically high" (and thus the complementary control signal /C2 changes its state from "logically high" to "logically low"), the signal available at the input of the transfer gate circuit arrangement or of the gate 116b, respectively, i.e. at the line 115b, is connected through to the output of the transfer gate circuit arrangement or of the gate 116b, i.e. to the line 117b.

When then the signal available at the control input 119b of the gate 116b again changes its state from "logically high" to "logically low" (and thus the complementary control signal /C2 changes its state again from "logically low" to "logically high"), the signal available at the input of the transfer gate circuit arrangement or of the gate 116b, respectively, i.e. at the line 115b, is again disconnected galvanically from the output of the transfer gate circuit arrangement or of the gate 116b, respectively, i.e. from the line 117b.

The gates 116a, 116d "of the first kind" have a structure that is different from that of the gate 116b "of the second kind" illustrated in FIG. 4. In accordance with the (tristate) inverter circuit arrangement illustrated in detail in FIG. 3, they comprise each two n-channel field effect transistors 126a, 126b and two p-channel field effect transistors 125a, 125b.

The n-channel field effect transistor 126a and the p-channel field effect transistor 125a have a connection similar to a conventional, simple inverter, with the exception that the drain of the n-channel field effect transistor 126a is not directly connected to the supply voltage, but by interconnection of the n-channel field effect transistor 126b, and that the drain of the p-channel field effect transistor 125a is not directly connected to the mass, but by interconnection of the p-channel field effect transistor 125b.

As is illustrated in FIG. 3, the drain of the n-channel field effect transistor 126a is—via a line 127—connected to the source of the n-channel field effect transistor 126b, and the drain of the n-channel field effect transistor 126b is—via a line 128—connected to the supply voltage.

Furthermore, the drain of the p-channel field effect transistor 125a is connected—via a line 129—to the source of the p-channel field effect transistor 125b, and the drain of the p-channel field effect transistor 125b is connected—via a line 130—to the mass.

As is further illustrated in FIG. 3, the gates of the n- or p-channel field effect transistors 125a, 126a, respectively, are connected with one another via a line 132, and are additionally connected to the line 115a (and thus form the input of the (tristate) inverter circuit arrangement).

Furthermore, the sources of the n- or p-channel field effect transistors 125a, 126a, respectively, are connected with one another via a line 131, and are additionally connected with a line 117—which is also connected to the line 118 (and thus form the output of the (tristate) inverter circuit arrangement).

The control signal C1 available at a control input 119a of the respective gate 116a, 116d is—via a control line 133a—supplied to the gate of the n-channel field effect transistor 126b.

Furthermore, the control signal C1 available at the control input 119a of the respective gate 116a, 116c is additionally supplied to the input of an inverter 134 via a line 133b, and the control signal /C1 that is output at the output of the inverter 134 and that is complementary to the control signal C1 is additionally supplied to the gate of the p-channel field effect transistor 125b.

The following effect is achieved thereby: As soon as the control signal C1 available at the control input 119a of the gate 116a changes its state from "logically high" to "logically low" (and thus the complementary control signal /C1 changes its state from "logically low" to "logically high"), the n- and the p-channel field effect transistors 125b, 126b are switched off (and thus the simple inverter formed by the n- and the p-channel field effect transistors 125a, 126a is disconnected from the supply voltage or mass, respectively, i.e. de-activated). The signal available at the input of the (tristate) inverter circuit arrangement or of the gate 116a, respectively, i.e. at the line 115a, then has no influence on the signal available at the output of the (tristate) inverter circuit arrangement or of the gate 116a, respectively, i.e. at the line 117a.

When the control signal C1 available at the control input 119a of the gate 116a then changes its state from "logically low" to "logically high" (and thus the complementary control signal /C1 changes its state from "logically high" to "logically low"), the n- and the p-channel field effect transistors 125b, 126b are switched on (and thus the simple inverter formed by the n- and the p-channel field effect transistors 125a, 126a is connected with the supply voltage or the mass, respectively, i.e. is de-activated).

Due to the two n- and p-channel field effect transistors 125a, 126a forming a simple inverter, the signal available at the input of the gate 116a, i.e. at the line 115a, is advanced in inverted form to the output of the gate 116a, i.e. to the line 117a, with the respectively one of the field effect transistors 125a, 126a constituting the load resistance for the respectively other field effect transistor 125a, 126a.

As is illustrated in FIG. 2, the corresponding outputs are (in a corresponding manner to the first and second gates 116a, 116b), also with the remaining gates 116d, 116e, connected via corresponding lines 117d, 117e to the line 118 which is connected to the output of the signal delay device 101.

As has already been mentioned above, corresponding control signals $C_1, C_2, \ldots, C_{n-1}, C_n$ are applied to the control inputs 119a, 119b, 119d, 119e of the gates 116a, 116b, 116d, 116e, namely such that respectively one of the control signals $C_1, C_2, \ldots, C_{n-1}, C_n$ is in a "logically high" state, and the respectively other control signals $C_1, C_2, \ldots, C_{n-1}, C_n$ are in a "logically low" state.

In this way, that signal delay element 103a, 103b, 103c, 103d, 103e may be selected whose output signal—possibly in inverted form (namely in the case of signal delay elements 103c, 103d where n is an odd number)—is to be connected through to the output 102b of the signal delay device 101.

Due to the inverted through-connection achieved by the gates 116a, 116d and the non-inverted through-connection achieved by the gates 116b, 116e of the signal that is output by the respectively selected signal delay element 103a, 103b, 103c, 103d, 103e, it is achieved that the signal OUT that is output at the output 102b of the signal delay device 101 corresponds to the signal IN at the input 102a of the signal delay device 101; it is, however, applied with an—adjustable—delay vis-à-vis thereto (namely with a delay corresponding to the delay time of the output signal of that signal delay element 103a, 103b, 103c, 103d, 103e whose output—possibly in inverted form—is just being connected through via the corresponding gate 116a, 116b, 116d, 116e to the output 102b of the signal delay device 101 (plus the delay time of the respectively active gate 116a, 116b, 116d, 116e)).

The respectively desired delay time between the input signal IN and the output signal OUT can be adjusted substantially more accurately or precisely than with the signal delay device 1 illustrated in FIG. 1 (namely in time steps of a dimension of t and not in time steps of a dimension of $T=t_a+t_b$).

In order to improve the characteristics of the signal delay device 101 illustrated in FIGS. 2, 3, and 4 with respect to the respectively occurring capacitive loads, in the case of an alternative embodiment—with otherwise identical structure of the signal delay device 101—in accordance with FIGS. 5a, 5b, an additional tristate inverter circuit arrangement 135, 136 may be connected between the output of each gate 116a, 116b, 116d, 116e (irrespective of whether "of the first kind" or "of the second kind") and the corresponding line 117a, 117b, 117d, 117e corrected with the line 118.

The respectively interposed tristate inverter circuit arrangement 135, 136 has a structure that corresponds to the structure of the tristate inverter circuit arrangement illustrated in FIG. 3 and acting as a gate 116a "of the first kind" there.

By means of the interposition of the above-mentioned tristate inverter circuit arrangements 135, 136 it is achieved that the circuits driving the lines 118 (here: the tristate inverter circuit arrangements 135, 136)—irrespective of which one of the gates 116a, 116b, 116d, 116e is just activated by applying a corresponding "logically high" control signal $C_1, C_2, \ldots, C_{n-1}, C_n$—all have an identical structure, and that thus—irrespective of which one of the gates 116a, 116b, 116d, 116e is activated—a respectively identical capacitive load results.

In a modification of the above-mentioned alternative embodiment (i.e. in a further alternative embodiment), a transfer gate circuit arrangement 137 may, in accordance with FIG. 6a, be connected between the output of each gate 116a, 116d "of the first kind" and the corresponding additional tristate inverter circuit arrangement 135 connected with the corresponding line 117a, 117d, wherein said transfer gate circuit arrangement 137 may have the same structure as the transfer gate circuit arrangement illustrated in FIG. 4 and acting as a gate 116b "of the second kind" there.

Furthermore, in this further alternative embodiment according to FIG. 6b, the above-mentioned gates 116b, 116e "of the second kind" may be replaced by corresponding gates 139 "of the first kind" (which may have a structure corresponding to that of the tristate inverter circuit arrangement illustrated in FIG. 3), and a respectively further tristate inverter circuit arrangement 138 (which may also have a structure corresponding to that of the tristate inverter circuit arrangement illustrated in FIG. 3 and acting as a gate 116a "of the first kind" there) may be connected between these gates 139 "of the first kind" and the corresponding additional tristate inverter circuit arrangement 136 connected with the respective line 117b, 117e.

The—interposed—transfer gate 137 illustrated in FIG. 6a may be designed such that the signals are advanced in such a delayed manner by the transmission gate 137 that the—total—delay time occurring during the advancement of the corresponding signals by the gate 116a, the transfer gate circuit arrangement 137, and the tristate inverter circuit arrangement 135 illustrated in FIG. 6a is as great as the—total—delay time occurring during the advancement of the corresponding signals by the gate 139, and the two tristate inverter circuit arrangements 138, 136 illustrated in FIG. 6b.

What is claimed is:

1. A digital signal delay device for converting a signal (IN) into a corresponding delayed signal (OUT), comprising a plurality of signal delay elements connected in series, wherein, as a function of the desired delay of the delayed signal (OUT), the respective output signal of a particular signal delay element is used for generating the delayed signal (OUT), wherein said signal delay elements each comprise one single inverter only, wherein said signal delay elements are respectively connected with corresponding gates, wherein as a function of the respectively desired delay, that gate is activated that is connected to the signal delay element whose output signal is to be used for generating the delayed signal (OUT), wherein when the output signal of the particular signal delay element is inverted vis-à-vis the signal (IN), the gate connected with the particular signal delay element is designed such that the gate advances the output signal in an inverted manner and, when the output signal of the particular signal delay element is non-inverted vis-à-vis the signal (IN), the gate connected with the particular signal delay element is designed such that the gate advances the output signal in a non-inverted manner.

2. The digital signal delay device according to claim 1, wherein as a function of the respectively desired delay, the output signal of the particular signal delay element used for generating the delayed signal (OUT) is inverted or non-inverted vis-à-vis the signal (IN).

3. The digital signal delay device according to claim 1, wherein the gates, depending on whether the gates are connected with a signal delay element whose output signal is inverted or non-inverted vis-à-vis the signal (IN), comprise an inverter circuit arrangement or a transfer gate circuit arrangement.

4. The digital signal delay device according to claim 1, wherein the gates, depending on whether the gates are connected with a signal delay element whose output signal is inverted or non-inverted vis-à-vis the signal (IN), comprise two inverter circuit arrangements, or a transfer gate circuit arrangement and an inverter circuit arrangement.

5. The digital signal delay device according to claim 1, wherein the gates, depending on whether the gates are connected with a signal delay element whose output signal is inverted or non-inverted vis-à-vis the signal (IN), comprise two inverter circuit arrangements and a transfer gate circuit arrangement, or three inverter circuit arrangements.

6. The digital signal delay device according to claim 5, wherein at least one of the inverter circuit arrangements is a tristate inverter circuit arrangement.

7. The digital signal delay device according to claim 1, wherein when the output signal of the particular signal delay element is inverted vis-à-vis the signal (IN), the gate connected with the particular signal delay element includes two n-channel field effect transistors and two p-channel field effect transistors, and when the output signal of the particular signal delay element is non-inverted vis-à-vis the signal (IN), the gate connected with the particular signal delay element includes one n-channel field effect transistor and one p-channel field effect transistor.

8. A digital signal delay device for converting a signal (IN) into a corresponding delayed signal (OUT), comprising a plurality of signal delay elements connected in series, wherein, as a function of the desired delay of the delayed signal (OUT), the respective output signal of a particular signal delay element is used for generating the delayed signal (OUT), wherein said signal delay elements each comprise one single inverter only, wherein said signal delay elements are respectively connected with corresponding gates, wherein as a function of the respectively desired delay, that gate is activated that is connected to the signal delay element whose output signal is to be used for generating the delayed signal (OUT), wherein when the output signal of the particular signal delay element is inverted vis-à-vis the signal (IN), the gate connected with the respective signal delay element is designed such that the gate advances the output signal in a non-inverted manner and, when the output signal of the particular signal delay element is non-inverted vis-à-vis the signal (IN), the gate connected with the respective signal delay element is designed such that the gate advances the output signal in an inverted manner.

9. The digital signal delay device according to claim 8, wherein as a function of the respectively desired delay, the output signal of the particular signal delay element used for generating the delayed signal (OUT) is inverted or non-inverted vis-à-vis the signal (IN).

10. The digital signal delay device according to claim 8, wherein when the output signal of the particular signal delay element is inverted vis-à-vis the signal (IN), the gate connected with the particular signal delay element includes one n-channel field effect transistor and one p-channel field effect transistor, and when the output signal of the particular signal delay element is non-inverted vis-à-vis the signal (IN), the gate connected with the particular signal delay element includes two n-channel field effect transistors and two p-channel field effect transistors.

11. The digital signal delay device according to claim 8, wherein the gates, depending on whether the gates are connected with a signal delay element whose output signal is inverted or non-inverted vis-à-vis the signal (N),—comprise an inverter circuit arrangement or a transfer gate circuit arrangement.

12. The digital signal delay device according to claim 8, wherein the gates, depending on whether the gates are connected with a signal delay element whose output signal is inverted or non-inverted vis-à-vis the signal (IN),—comprise two inverter circuit arrangements, or a transfer gate circuit arrangement and an inverter circuit arrangement.

13. The digital signal delay device according to claim 8, wherein the gates, depending on whether the gates are connected with a signal delay element whose output signal is inverted or non-inverted vis-à-vis the signal (IN),—comprise two inverter circuit arrangements and a transfer gate circuit arrangement, or three inverter circuit arrangements.

14. The digital signal delay device according to claim 1, wherein at least one of the inverter circuit arrangements is a tristate inverter circuit arrangement.

15. A digital signal delay device for converting an input signal into a corresponding delayed signal, the device comprising a first signal delay element, including only one inverter, configured to receive the input signal;

a first gate, connected to the output of the first signal delay element, configured to output the delayed signal when the first gate is activated, the first gate including two p-channel field effect transistors and two n-channel field effect transistors, the gates of one of the two p-channel field effect transistors and one of the two n-channel field effect transistors connected with the other and with the input of the first gate, and the sources of the one of the two p-channel field effect transistors and the one of the two n-channel field effect transistors connected with the other and with the output of the first gate;

a second delay element, connected in series with the first delay element, including only one inverter, configured to receive the output from the first signal delay element; and a second gate, connected to the output of the second signal delay element, configured to output the delayed signal when the second gate is activated, the second gate including one p-channel field effect transistor and one n-channel field effect transistor, the drains of the one n-channel field effect transistor and the one p-channel field effect transistor connected with the other and with the input of the second gate, and the sources of the one n-channel field effect transistor and the one p-channel field effect transistor connected with the other and with the output of the second gate, wherein the first gate is configured to invert the output signal of the first delay element and, the second gate is configured to advance the output signal of the second delay element in a non-inverted manner.

* * * * *

UNITED STATES PATENT AND TRADEMARK OFFICE
CERTIFICATE OF CORRECTION

PATENT NO. : 6,906,569 B2
DATED : June 14, 2005
INVENTOR(S) : Brox

It is certified that error appears in the above-identified patent and that said Letters Patent is hereby corrected as shown below:

Column 11,
Line 47, replace "(N)," with -- (IN), --.

Column 12,
Line 11, replace "claim 1" with -- claim 13 --.

Signed and Sealed this

Eleventh Day of April, 2006

JON W. DUDAS
*Director of the United States Patent and Trademark Office*